United States Patent [19]
Casati et al.

[11] Patent Number: 5,763,296
[45] Date of Patent: Jun. 9, 1998

[54] METHOD FOR FABRICATING AN ELECTRONIC DEVICE STRUCTURE WITH STUDS LOCATING LEAD FRAME ON BACKING PLATE

[75] Inventors: Paolo Casati; Marziano Corno; Giuseppe Marchisi, all of Milan, Italy

[73] Assignee: SGS-Thomson Microelectronics S.r.l., Agrate Brianza, Italy

[21] Appl. No.: 289,773

[22] Filed: Aug. 12, 1994

Related U.S. Application Data

[62] Division of Ser. No. 982,314, Nov. 27, 1992, Pat. No. 5,338,971.

[30] Foreign Application Priority Data

Nov. 21, 1991 [IT] Italy .................. MI91A3208

[51] Int. Cl.⁶ .......................... H01L 21/56; H01L 21/58; H01L 21/60
[52] U.S. Cl. .......................... 438/121; 438/122; 438/123; 438/124; 438/127
[58] Field of Search ................ 437/220; 257/672, 257/676, 785; 438/121, 122, 123, 124, 127

[56] References Cited

U.S. PATENT DOCUMENTS

| | | | |
|---|---|---|---|
| 4,132,856 | 1/1979 | Hutchison | 357/72 |
| 4,215,360 | 7/1980 | Eytcheson | 357/70 |
| 4,975,761 | 12/1990 | Chu | 357/72 |
| 5,091,341 | 2/1992 | Asada et al. | 437/212 |
| 5,229,918 | 7/1993 | Della Bosa et al. | 257/712 |

FOREIGN PATENT DOCUMENTS

| | | | |
|---|---|---|---|
| 0497744 | 5/1992 | European Pat. Off. | |
| 0484297 | 6/1992 | European Pat. Off. | |
| 54-55169 | 5/1979 | Japan | 257/676 |
| 55-1195 | 1/1980 | Japan | 257/676 |
| 2199988 | 7/1988 | United Kingdom | |

*Primary Examiner*—David Graybill
*Attorney, Agent, or Firm*—Robert Groover

[57] ABSTRACT

A process for making an electronic device structure which comprises a metal plate, a semiconductor material chip attached to the plate, terminal leads, interconnection wires between the leads and metallized regions of the chip, and a plastic body which encapsulates the whole with the exception of a surface of the plate and part of the leads. This structure has means of electrical connection between at least one metallized region and the metal plate which comprise at least one metal beam resting onto the plate and being attached thereto by studs integral with the plate, and at least one wire welded between a metallized region of the chip and the metal beam between the studs. At least a portion of the beam and its connection wire are encapsulated within the plastics body.

3 Claims, 1 Drawing Sheet

METHOD FOR FABRICATING AN ELECTRONIC DEVICE STRUCTURE WITH STUDS LOCATING LEAD FRAME ON BACKING PLATE

This is a divisional application of Ser. No. 07/982,314, filed Nov. 27, 1992, now U.S. Pat. No. 5,338,971.

BACKGROUND AND SUMMARY OF THE INVENTION

This invention relates to electronic semiconductor devices, and particularly to a packaged device structure which includes a chip on a metal plate, surrounded by a plastic body from which electrical leads protrude.

As is known, integrated circuits and other active electronic devices or components[1] are typically formed on small chips (or "dice") of a monocrystalline semiconductor material. Typically these chips have a surface area on the order of a few square millimeters, and require for their connection to an external electric circuit special supporting, enclosing and electric interconnection structures.

[1] The term "integrated circuits" usually refers to devices which include many transistors interconnected to provide analog or digital or mixed circuits. However, many of the packaging requirements of integrated circuits also apply to other semiconductor devices, such as power transistors or thyristors, discrete diodes or sensor devices, optoelectronic devices, etc.

A typical structure suited for the purpose comprises basically a plastic body enclosing a chip which is connected, by thin wires soldered to metallized regions specially provided on its surface, to corresponding electric conductors led out of the plastic body. With power integrated circuits (which operate at high currents, and therefore must dissipate a relatively large amount of heat), such structures also comprise a small metal plate through which a chip mounted thereon can transfer the heat generated during its operation to the environment.

In manufacturing such power device packages, a chip is secured on the metal plate, either by soldering with a low-melt alloy (such as a lead-tin alloy), or by cementing with a suitable adhesive such as a conductive or nonconductive epoxy adhesive. As shown in FIG. 2, a "lead frame" 16 (i.e. a set of metal strips 11 still left joined to one another by interconnecting sections) is mounted to the metal plate in an electrically insulated manner therefrom. (In the presently preferred embodiment, this insulation is actually provided by the resin body 10, but of course alternatives can be used instead. During assembly the strips are kept in position by the interconnecting portions 15 and the beams 19 fixed to the plate 12.)

Thin wires 18 (of gold in the presently preferred embodiment) are soldered, on the one side, to the metallized regions of the chip using a low-melt alloy, and on the other side, welded to the ends of the metal strips using a so-called "thermosonic" process (wherein heat and ultrasound are applied simultaneously). Thereafter, the assembly is placed into a specially provided mold, into which a resin material such as a thermosetting epoxy resin is then introduced in a liquefied state to surround the chip and the bond wires. This resin is then cured to produce a solid plastic body which totally encapsulates the above-described elements, except for part of the metal plate and part of the device terminal leads. The outer portions of the lead frame, which have held the leads in place, are then removed (e.g. by blanking) to yield the finished electronic product, with multiple electrically separate leads exposed.

It is necessary in some cases that at least one of the metallized regions on the chip be connected electrically to the metal plate. According to a prior art technique, this connection is established by a thin wire, usually made of gold: one end is attached to the metallized region of the chip, and the other end is attached, by ultrasonic thermal welding, to the same surface of the plate where the chip is mounted. However, this type of connection is not as reliable as it should be; it has been found, in particular, that the wire tends to separate from the plate due to failure of the welded joint. A cause of this problem has been found to be contamination of the plate surface by the chip attachment material, whether a soldering alloy or an adhesive, so that quality of the ultrasonic thermal weld becomes low and likely to fail under mechanical or electrical stresses, however slight.

To remove such causes for failure, it has been proposed to form a groove around the plate area where the chip is to be affixed. The groove provides a barrier to limit the outflow of molten solder or liquefied adhesive across the plate, thereby lowering the risk of the surface being contaminated.

It has been found that, despite this precautionary measure, the faulty pieces due to the connecting wire to the plate coming loose are still excessive.

The disclosed innovations provide an electronic device structure which is free from the aforementioned drawback. This object is achieved by a structure which includes a shaped metal connection (e.g. a swaged joint) between widened portion of the lead frame and a metal backing plate to which the semiconductor chip is attached. Instead of the usual ground wire routing, ground wires are connected from the chip to the widened portions of the lead frame.

BRIEF DESCRIPTION OF THE DRAWING

The present invention will be described with reference to the accompanying drawings, which show important sample embodiments of the invention and which are incorporated in the specification hereof by reference, wherein.

DESCRIPTION OF THE PREFERRED EMBODIMENTS

The numerous innovative teachings of the present application will be described with particular reference to the presently preferred embodiment. However, it should be understood that this class of embodiments provides only a few examples of the many advantageous uses of the innovative teachings herein. In general, statements made in the specification of the present application do not necessarily delimit any of the various claimed inventions. Moreover, some statements may apply to some inventive features but not to others.

Figure 2:
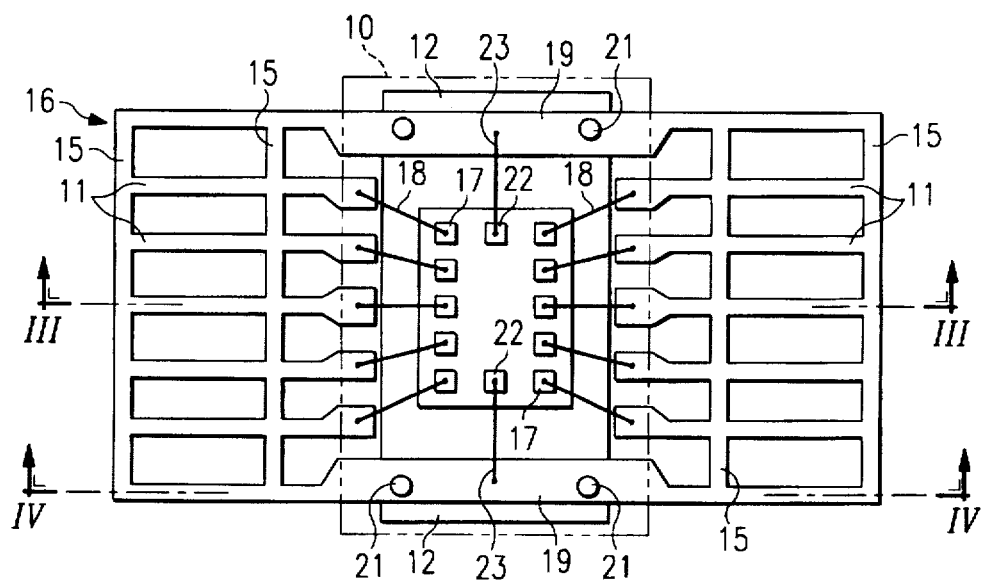
FIG. 2 is a plan view of the structure in FIG. 1, as it appears before the molding step.
Figure 3:
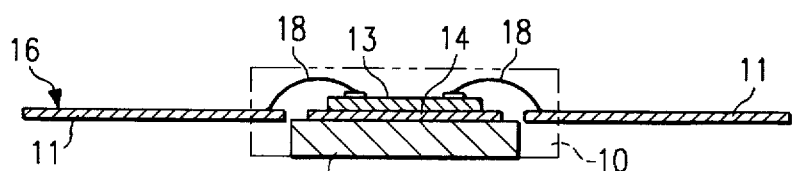
FIG. 3 is a sectional view taken along line III—III in FIG. 2.
Figure 4:
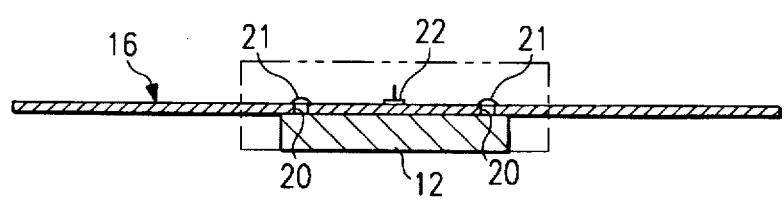
FIG. 4 is a sectional view taken along line IV—IV in FIG. 2.

The structure of an electronic semiconductor device shown in the various Figures comprises a body of a plastics material, designated 10, a multiplicity of metal strips 11, a metal plate 12 serving support and heat sink functions, and a chip 13 of a semiconductor material having (e.g.) an integrated circuit formed thereon. The chip 13 is joined to the metal plate by means of a layer 14 of soldering alloy. The leads 11 are formed as usual by blanking off a single piece of sheet metal and before being separated from one another after the molding process, preferably again by blanking, are held together by interconnecting sections 15 into a framework generally designated 16, as shown in FIG. 2, which represents the structure prior to being encapsulated in plastics.

The plate 12 and the lead frame 16 are made of copper, in the presently preferred embodiment, but of course alternatives can be used.

The lead ends within the framework 16 are connected, in the known manner described hereinbefore, to the metallized regions (bond pads) 17 of the chip by means of thin gold wires 18.

According to the invention the framework 16 has two opposite side strips, blanked off the same sheet metal piece, which form two beams 19 inside the plastic body. Such beams are extended, in the embodiment illustrated by the drawing, to the body outside with narrowing portions (like those of the leads 11). Each beam 19 has two holes 20 for mounting the framework 16 to the plate 12 with the aid of special studs 21 integral with the plate. These are made of an electrically conductive material and formed preferably by dishing the plate simultaneously with the blanking step whereby the plate itself is formed. After passing the studs 21 through the holes 20, the studs 21 are preferably swaged to secure the beams 19 and the whole framework 16 in place.

Two metallized regions 22 of the chip 13, which correspond to the electric ground terminal of the integrated circuit, are connected, through respective thin golden wires 23, to the beams 19 in the intermediate areas between the supporting studs 21. Thus, these two areas 22 are connected electrically to the metal plate 12 by the golden wires 23, beams 19, and studs 21.

Figure 1:
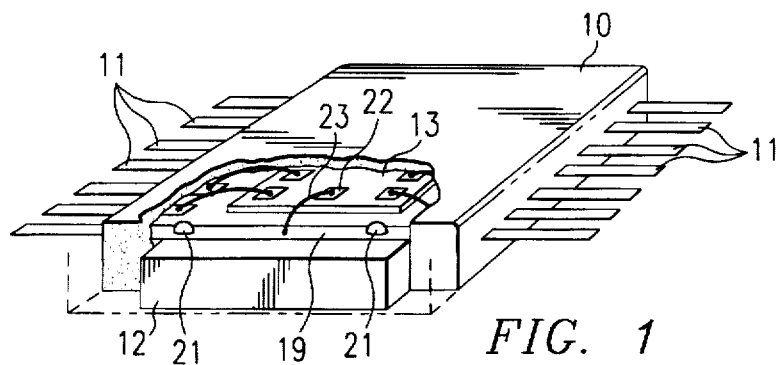
FIG. 1 is a perspective view of a structure according to the invention, with a part removed to show its interior.

The formation of the plastic body 10 and blanking of the interconnecting sections 15 of the frame 16 are performed by conventional techniques to provide a structure like that shown in FIG. 1.

The outward appearance of the finished package of FIG. 1 is similar to that of conventional integrated circuit supporting and enclosing structures. However, despite this resemblance in outward appearance, the structure of FIG. 1 has been shown to be much more reliable than known structures as relates to the electric connection between the metallized regions forming the electric ground terminals and the sheet metal. The reason for this seems to be, in part, that any contaminations of the plate surface (due, for instance, to traces of the fastening material, i.e. solder or adhesive, incidentally dropped onto regions of the plate outside the area bordered by the containment groove) would not affect the ground wire weldment because the wire is welded to a different portion of the plate, and above all that lower mechanical wire stresses are applied to the weldment at the remote end from the chip. It would appear, in fact, that while the weldment on the beams has the same strength characteristics as a like weldment performed on the plate, the shear forces which develop between the metal and the plastics during the cooling stage following the molding step and during normal thermal cycles of operation, due to the difference in the thermal expansion coefficients of the metal and the plastics, are far smaller in the structure of this invention. This effect is likely to originate from the beams being entrained by the plastics such that the welded joint will follow in part the shrinkages and expansions undergone by the plastics without opposing them.

Notice that the structure of this invention affords further non-negligible advantages, additionally to improved reliability as described above, such as a simplified manufacturing process, thanks to the possibility of eliminating the containment groove around the chip, because surface contamination by the material used for securing the chip is no longer a problem for the ground wire welding, and the facilitated assembly of the lead frame, since the latter can be secured at an exact and stable location on the plate by means of the holes and the studs.

FURTHER MODIFICATIONS AND VARIATIONS

It will be recognized by those skilled in the art that the innovative concepts disclosed in the present application can be applied in a wide variety of contexts. Moreover, the preferred implementation can be modified in a tremendous variety of ways. Accordingly, it should be understood that the modifications and variations suggested below and above are merely illustrative. These examples may help to show some of the scope of the inventive concepts, but these examples do not nearly exhaust the full scope of variations in the disclosed novel concepts.

While a single embodiment of the invention has been illustrated and described, several variants and modifications are feasible within the scope of this inventive concept. As an example, the beams could have no extensions outside the plastics body, i.e. could be fully encapsulated within the plastics body, or a single beam could be provided instead of two, or each beam could be connected to the plate by a single electrically conductive member, and in general, the latter may be implemented in other forms and constructions than the studs illustrated and described hereinabove.

Similarly, the studs can be formed to be slightly tapered (for rapid emplacement of the lead frame), or can be made essentially cylindrical bosses. For another example, the studs do not have to be swaged. Alternatively, the lead frame may simply be pressed onto the studs in a force-fit, or welded, soldered or brazed onto the studs. Alternatively, it is even possible to use separate rivets to provide this attachment. However, many of these alternatives are less preferred, and much less advantageous, than the presently preferred embodiment.

For another example, it is also possible to route one or more additional grounding wires from the chip to the plate, in addition to the wires from the chip to the beam(s).

For another example, it is also possible to route one or more additional grounding wires from the chip to the mounting stud, in addition to the wires from the chip to the beam(s).

For another example, note that the solder containment groove around the die attach area can optionally be added or omitted.

Similarly, the disclosed innovations can also be applied to a package with more or fewer leads than that shown.

Similarly, the disclosed innovations can also be applied to a package in which only one end of the metal backing plate protrudes from the epoxy.

Similarly, the disclosed innovations can also be applied to a package in which no part of the metal backing plate protrudes from the epoxy (although the disclosed innovations would be much less advantageous in such a context).

Similarly, the disclosed innovations can also be applied to an epoxy-encapsulated multi-chip module.

Similarly, while the presently preferred embodiment has been described in relation to a package with flat leads, it should be appreciated that the disclosed innovations can also be adapted to a wide variety of packages which are fabricated using lead frames, such as DIPs, mini-DIPs, J-leads, etc.

Similarly, additional ground wire connections to each beams, from additional ground bond pads, can optionally be used, to reduce the resistance to ground.

As will be recognized by those skilled in the art, the innovative concepts described in the present application can be modified and varied over a tremendous range of applications, and accordingly the scope of patented subject matter is not limited by any of the specific exemplary teachings given.

What is claimed is:

1. A method of forming an integrated circuit structure, comprising:
   (a) providing a lead frame having a plurality of metal strips which define an open area having essentially the shape of an elongated rectangle, said lead frame having strips projecting toward said open area along only the two longest sides of said open area, and strips which define the two shortest sides of said rectangle;
   (b) attaching an integrated circuit, which has a plurality of bond pads, to a metal plate which serves as a heat sink;
   (c) attaching said metal plate to said lead frame in a manner which provides both thermal connection and electrical connection, wherein said integrated circuit is positioned within said open area;
   (d) providing electrical connections from said multiple ones of said bond pads to multiple ones of said strips projecting toward said open area along the two longest sides of said open area;
   (e) providing electrical connections from one of said bond pads to one of said metal strips which define the two shortest sides of said rectangle;
   (f) encapsulating said integrated circuit, portions of said metal plate, and portions of said lead frame in an insulating material;
   (g) removing portions of said lead frame so that ones of said strips provide electrically separate external connections to said bond pads.

2. The method of claim 1, wherein an electrical connection from one of said bond pads to said metal plate is provided through a portion of said lead frame.

3. The method of claim 2, wherein said electrical connection from one of said bond pads to said metal plate is provided through a portion of said lead frame which is wider than other portions of said lead frame.

* * * * *